US00RE34503E

United States Patent [19]

[11] E Patent Number: Re. 34,503

Sakakibara et al.

[45] Reissued Date of Patent: Jan. 11, 1994

[54] IMAGING DEVICE

[75] Inventors: Kenji Sakakibara, Ichinomiya; Michitoshi Akao, Nagoya; Shigeyuki Hayashi, Nagoya; Jun Sakai, Nagoya, all of Japan

[73] Assignee: Brother Kogyo Kabushiki Kaisha, Aichi, Japan

[21] Appl. No.: 438,341

[22] Filed: Nov. 16, 1989

Related U.S. Patent Documents

Reissue of:

[64] Patent No.: 4,714,943
Issued: Dec. 22, 1987
Appl. No.: 21,637
Filed: Mar. 4, 1987

[30] Foreign Application Priority Data

Mar. 11, 1986 [JP] Japan ..... 61-51409
Mar. 11, 1986 [JP] Japan ..... 61-51410
Mar. 27, 1986 [JP] Japan ..... 61-43929

[51] Int. Cl.[5] ..... G03B 27/32; G03B 27/52

[52] U.S. Cl. ..... 355/27; 354/304; 430/138

[58] Field of Search ..... 355/27; 430/138; 354/86, 303, 304, 297; 100/106, 155 R, 163 A, 158 R, 169; 118/116

[56] References Cited

U.S. PATENT DOCUMENTS

| | | | |
|---|---|---|---|
| Re. 32,126 | 4/1986 | Sasaki | 100/158 R |
| 1,953,165 | 4/1934 | George | 72/21 |
| 2,191,144 | 2/1940 | Hornbostel | 100/106 |
| 2,732,591 | 1/1956 | Whittum | 72/248 |
| 2,850,952 | 9/1958 | Hornbostel | 100/163 A |
| 2,921,426 | 1/1960 | Heth | 56/1 |
| 3,386,824 | 6/1968 | Miller | 430/138 |
| 3,678,846 | 7/1972 | Bjorkegren | 100/155 R |
| 3,990,391 | 11/1976 | Singh | 118/116 |
| 3,999,202 | 12/1976 | Goto | 354/304 |
| 4,022,122 | 5/1977 | Moser et al. | 100/158 R |
| 4,044,366 | 8/1977 | Goto | 354/86 |
| 4,145,965 | 3/1979 | Kikuchi et al. | 100/176 |
| 4,174,163 | 11/1979 | Oi et al. | 354/86 |
| 4,192,229 | 3/1980 | Tsunoi et al. | 100/158 R |
| 4,194,382 | 3/1980 | Kajiwara | 72/243 |
| 4,235,166 | 11/1980 | Tsunoi | 100/158 R |
| 4,253,757 | 3/1981 | Friedman et al. | 354/304 |
| 4,256,959 | 3/1981 | Monette | 250/235 |
| 4,338,016 | 7/1982 | Peck et al. | 354/303 |
| 4,343,234 | 8/1982 | Sasaki | 100/158 R |
| 4,347,784 | 9/1982 | Pav et al. | 100/162 R |
| 4,356,764 | 11/1982 | Haugen | 100/169 |
| 4,360,260 | 11/1982 | Eloranta et al. | 354/304 |
| 4,369,646 | 1/1983 | Kajiwara | 72/243 |
| 4,399,209 | 8/1983 | Sanders et al. | 430/138 |
| 4,417,803 | 11/1983 | Kobayashi et al. | 430/124 X |
| 4,440,846 | 4/1984 | Sanders et al. | 430/138 |
| 4,448,516 | 5/1984 | Arney et al. | 355/27 |
| 4,480,459 | 11/1984 | Feldman et al. | 72/243 |
| 4,502,312 | 3/1985 | Marchioro | 72/243 |
| 4,551,407 | 11/1985 | Sanders et al. | 430/138 |
| 4,568,167 | 2/1986 | Sorli | 354/304 |
| 4,602,408 | 7/1986 | Noe et al. | 29/113 AD |
| 4,624,560 | 11/1986 | Beery | 355/27 |
| 4,648,699 | 3/1987 | Holycross et al. | 354/297 |
| 4,691,548 | 9/1987 | Richter et al. | 72/21 |
| 4,727,392 | 2/1988 | Stone et al. | 354/304 |

FOREIGN PATENT DOCUMENTS

| | | |
|---|---|---|
| 267607 | 12/1912 | Fed. Rep. of Germany . |
| 54-48251 | 4/1979 | Japan . |
| 58-15750 | 4/1983 | Japan . |

*Primary Examiner*—Richard A. Wintercorn
*Attorney, Agent, or Firm*—Kane, Dalsimer, Sullivan, Kurucz, Levy, Eisele and Richard

[57] ABSTRACT

An imaging device wherein a latent image is formed on a photo and pressure sensitive recording sheet by exposing a light thereon and the latent image is then developed by applying a pressure thereon. The degree of pressing is automatically and/or manually controlled so as to obtain a visible image of stable color deepness and of good quality.

15 Claims, 7 Drawing Sheets

IMAGING DEVICE

Matter enclosed in heavy brackets [ ] appears in the original patent but forms no part of this reissue specification; matter printed in italics indicates the additions made by reissue.

BACKGROUND OF THE INVENTION

This invention relates to an imaging device adopted for photo-printing system such as photoprinters and photocopy machines, and more particularly, an imaging device for fixing an image by applying a pressure on a photo and pressure sensitive recording sheet on which a latent image is formed by exposing a light thereon.

The photo and pressure sensitive recording sheet generally comprises, for instance as disclosed in the U.S. Pat. No. 4,440,846, microcapsules and chromogenic materials laid one upon another on a substrate such as a paper. The hardness of microcapsules increases when exposed to light while the chromogenic materials are colourized when mixed with a substance enveloped in microcapsules. Accordingly, in order to print an image on this type recording sheet, first a latent image is formed by exposing a light thereon to harden the microcapsules in the area on the sheet corresponding to the negative image of an original manuscript, and thereafter the latent image is developed by applying a pressure thereon to rupture the unhardened microcapsules in the area where the light is exposed. With this pressure application, the chromogenic materials on the recording sheet in the area where the light is not exposed are colourized as they react with the substance streamed out of the ruptured microcapsules. Thus, the positive image is fixedly printed on the recording sheet. Generally, with the imaging device utilizing the photo and pressure sensitive recording sheet, the developement is carried out by passing the sheet between the pair of pressing rollers.

The deepness level of colourization of chromogenic materials is influenced by the hardness of microcapsules and the hardness thereof depends upon the degree of exposure, i.e., the exposure time and the luminous flux. On the contrary, when the degree of exposure is fixed, the deepness of colourization of chromogenic materials is influenced by the degree of pressing, i.e., the pressing time and the pressure. FIG. 8 is a [gragh] *graph* showing the characteristic curve of the general relationship between the pressure (kg) and the colourization level (%) under the condition that the degree of exposure and the pressing time are fixed. The inclination angle of the characteristic curve decreases when the degree of exposure is increased or when the pressing time is decreased. In other words, the deepness of colourization depends upon the degree of exposure and/or the degree of pressing.

In the prior devices, however, the pressure applied by the pressing rollers is predetermined depending upon the thickness of the recording sheet and so on. Accordingly, when the degree of exposure for forming the latent image on the sheet is varied by, for instance, the changing with time of the condition of a light source, which results in excess or shortrage of exposure and the hardening level of microcapsules is varied. But, as the pressure applied by the pressing rollers is always constant as above described in the prior devices, the deepness level of the colourization of the chromogenic materials on the recording sheet varies and is not uniform, thus it becomes impossible to obtain the visible image of the stable colour deepness.

Moreover, a linear-shape light source is generally utilized when exposing a light on the recording sheet and, as illustrated in FIG. 9 which shows a luminous flux distribution of the linear-shape light source, the luminous flux is the highest at the lateral center of the linear-shape light source and gradually decreases toward the ends thereof. In general, the effective light-emission length of the linear-shape light source is the length wherein the luminous flux does not decrease more than 20 percents, and therefore, both end portions of the linear-shape light source are not utilized for exposing a light on the recording sheet in the photo-printing system. However, even within the effective light-emission area of the linear-shape light source, there are differences in the luminous flux so that the hardness level of light exposed microcapsules differs depending upon their positions relative to the linear-shape light source. Accordingly, when the degree of the pressing applied thereto is substantially same, the deepness level of colourizing becomes uneven depending upon the positions, thus the colour deepness of the image printed becomes uneven.

SUMMARY OF THE INVENTION

Therefore, it is an object of the invention to provide an improved imaging device capable of regulating the colour deepness of a visible image to be constant regardless of the change of a degree of exposure caused by the difference of the lightening condition of a light source and/or by the luminous flux distribution of a light source.

In one aspect of this invention, there is provided an imaging device comprising; means for exposing a light on a photo and pressure sensitive recording sheet for forming a latent image thereon, means for applying a pressure on said recording sheet for developing said latent image thereon, and means for controlling a degree of pressing applied to said recording sheet by said pressure applying means. The degree of pressing is controlled by varying the pressure itself and/or the pressing time. Moreover, the control is carried out automatically and/or manually.

In other aspect of this invention, there is provided an imaging device wherein a latent image is formed on a photo and pressure sensitive recording sheet by exposing a light thereon and the latent image is then developed by applying a pressure thereon with a pair of pressing rollers, the improvement which comprises in that the diameter of at least one of said pressing rollers being decreased from the lateral center portion toward both ends portions thereof.

BRIEF DESCRIPTION OF THE ACCOMPANYING DRAWINGS

DESCRIPTION OF THE PREFERRED EMBODIMENTS

Figure 1:
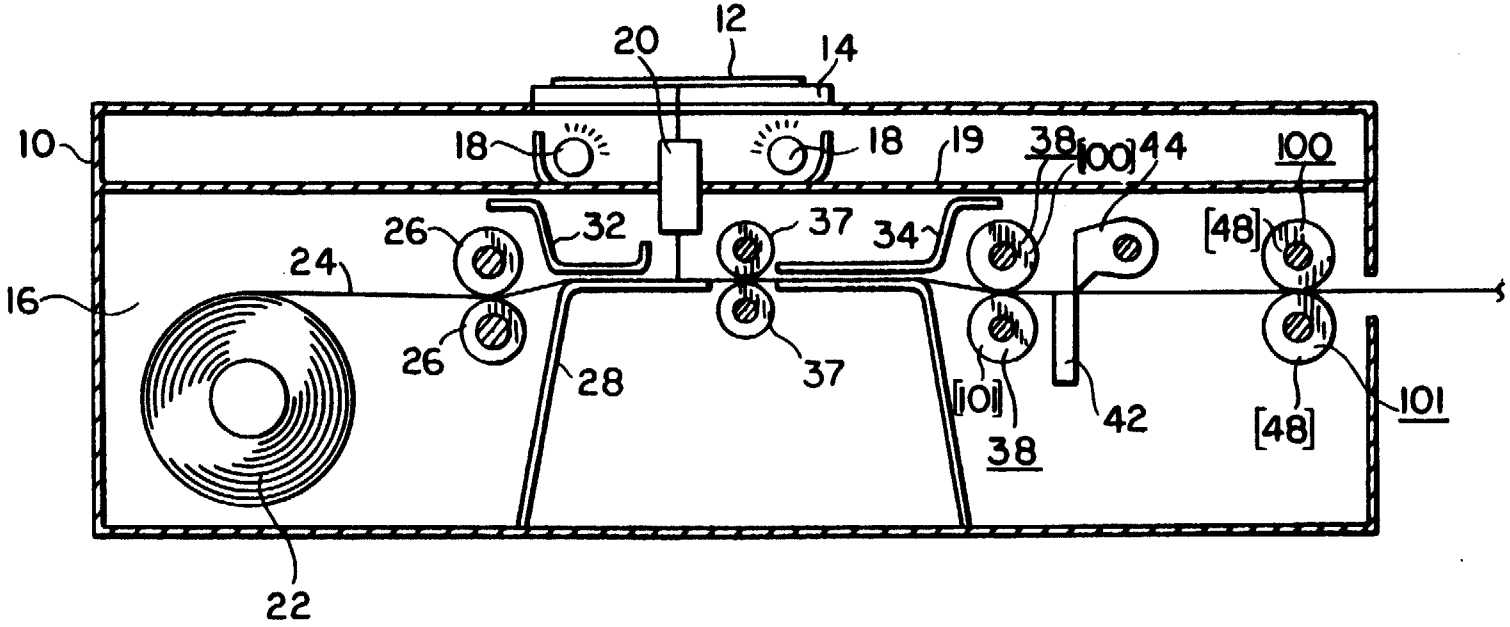
FIG. 1 is a side view showing a photocopy machine mechanism embodying the invention.
Figure 2:
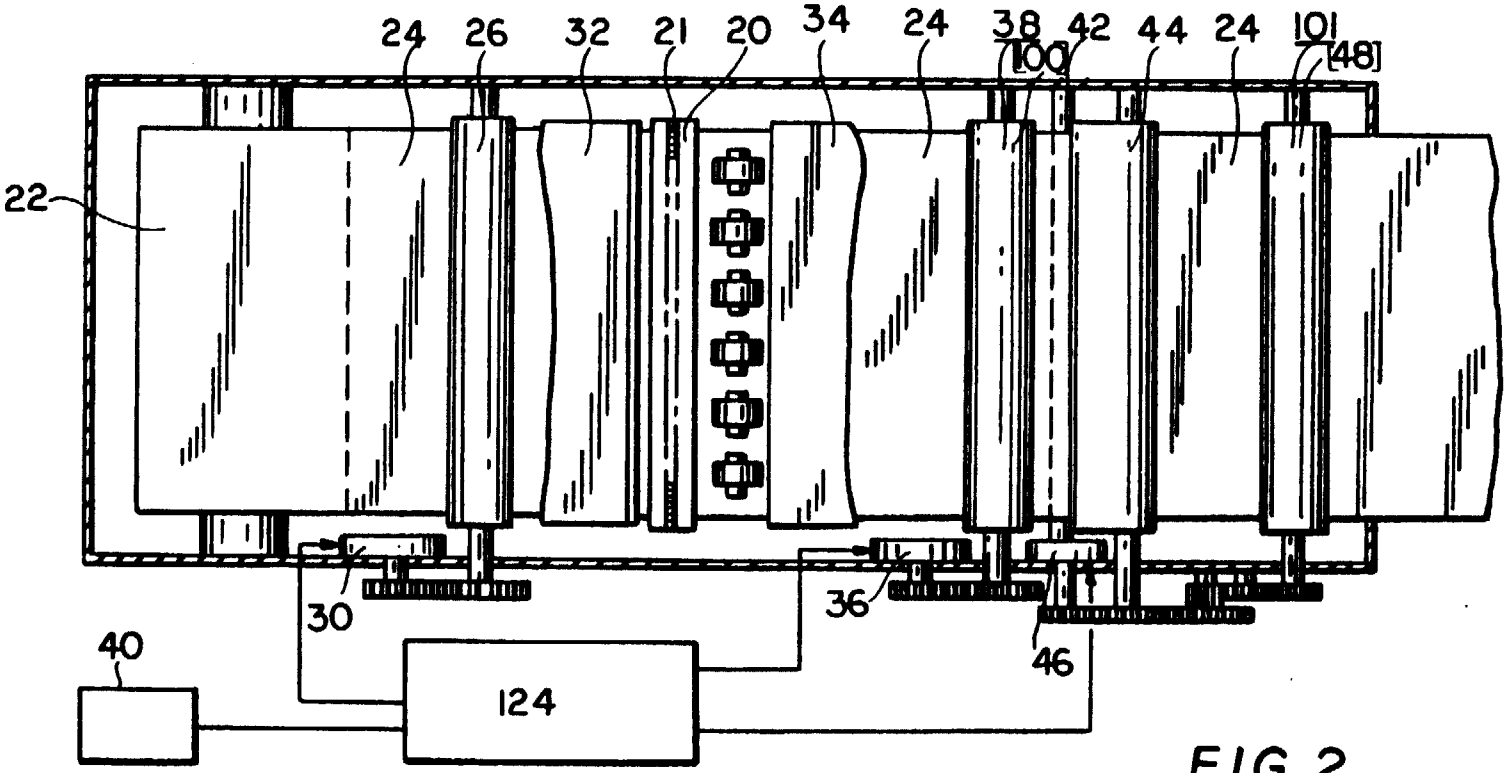
FIG. 2 is a plan view of a photocopy machine shown in FIG. 1.

Illustrated in FIGS. 1 and 2 is a photocopy machine emboding the invention. In this machine, a photo and pressure sensitive recording sheet 24 rolled on a sheet roller 22 is fed to a light exposing area by a pair of feeding rollers 26·26.

Above the light exposing area, a transparent rack 14 for setting thereon an original manuscript 12 to be copied is slidably mounted and is slid at a predetermined speed by a motor 40. The transparent rack 14 is arranged on the upper surface of a housing 10, while the sheet roller 22 is arranged inside a dark space 16 which is formed in the housing 10 by laterally arranging a partition plate 19 therein. On the partition plate 19, a pair of linear-shape light sources 18·18 are arranged and a rod-lens alley 20, which vertically passes through the partition plate 19 and laterally extends over the lateral size of the recording sheet 24, is provided between the light sources 18·18.

The above pair of light sources 18·18 are to expose a light against the lower surface of the original manuscript 12 through the transparent rack 12. The light reflected from the lower surface of the original manuscript 12 is led into the dark space 16 through the rod-lens alley 20. The rod-lens alley 20 comprises, for instance, a plurality of optical fibers 21 disposed in parallel which function as a convex lens. Through the rod-lens alley 20, the negative image of that on the lower surface of the original manuscript 12 faced to the upper side of the rod-lens alley 20 is focused on the photo and pressure sensitive sheet 24. The above optical fiber 21 is made of a photo-permeable glass or acrylic resin and the refraction ratio thereof increases from the axial center to the peripheral side thereof.

Inside the dark space 16, the feed rollers 26·26 are rotated by a motor 30 and an upper stream guide plate 32 and a down stream guide plate 34 are provided for horizontally guiding the sheet 24 on an exposure rack 28. The recording sheet 24 introduced between the exposure rack 28 and the guide plates 32·34 is exposed to the light projected from the lower end of the rod-lens alley 20. A pair of guide rollers 37·37 are arranged between the guide plates 32–34.

The sheet 24 passed the exposing rack 28 is then introduced into a cutting mechanism 40 by driving rollers 38·38 rotated by a driving motor 36. The cutting mechanism comprises a fixed blade 42 secured to the housing 10 and a movable blade 44 reciprocatively swung toward the fixed blade 42 by a driving motor 46. The sheet 24 is cut when passing between the blades 42·44.

At downstream of the cutting mechanism, a pair of pressing rollers 100·101 rotated by the driving motor 46 are arranged, by which the pressure is applied against the sheet 24. The motors 30·36·40·46 are pulse-motors and operated with predetermined timings by a control unit 124 equipped with a micro-computer, and when the sheet [14] *24* is cut by the blades 42–44 the motors 30·34 are reversely operated to rewind the sheet [14] *24* by the sheet roller 22 in a predetermined amount so as to reset the front end of the sheet [14] *24* below the rod-lens alley 20 for the next copying.

Figure 3:
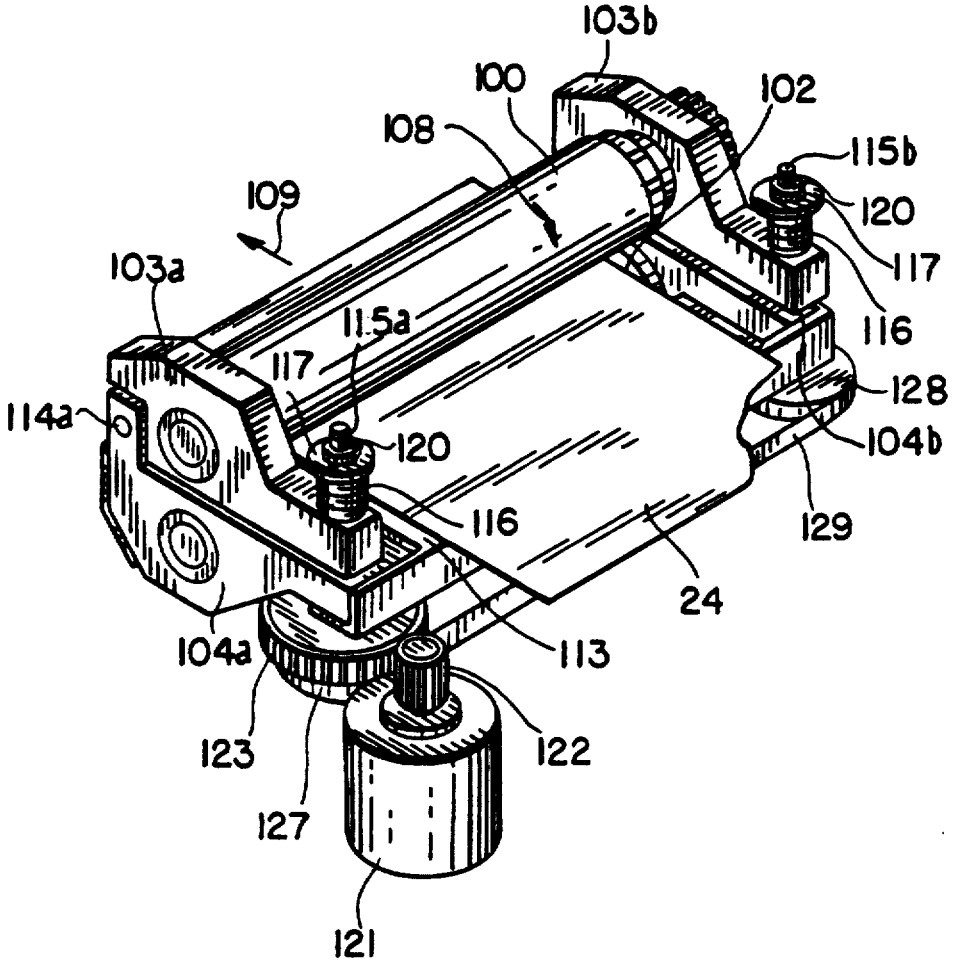
FIG. 3 is a perspective view showing a pressing mechanism of the photocopy machine shown in FIG. 1.
Figure 4:
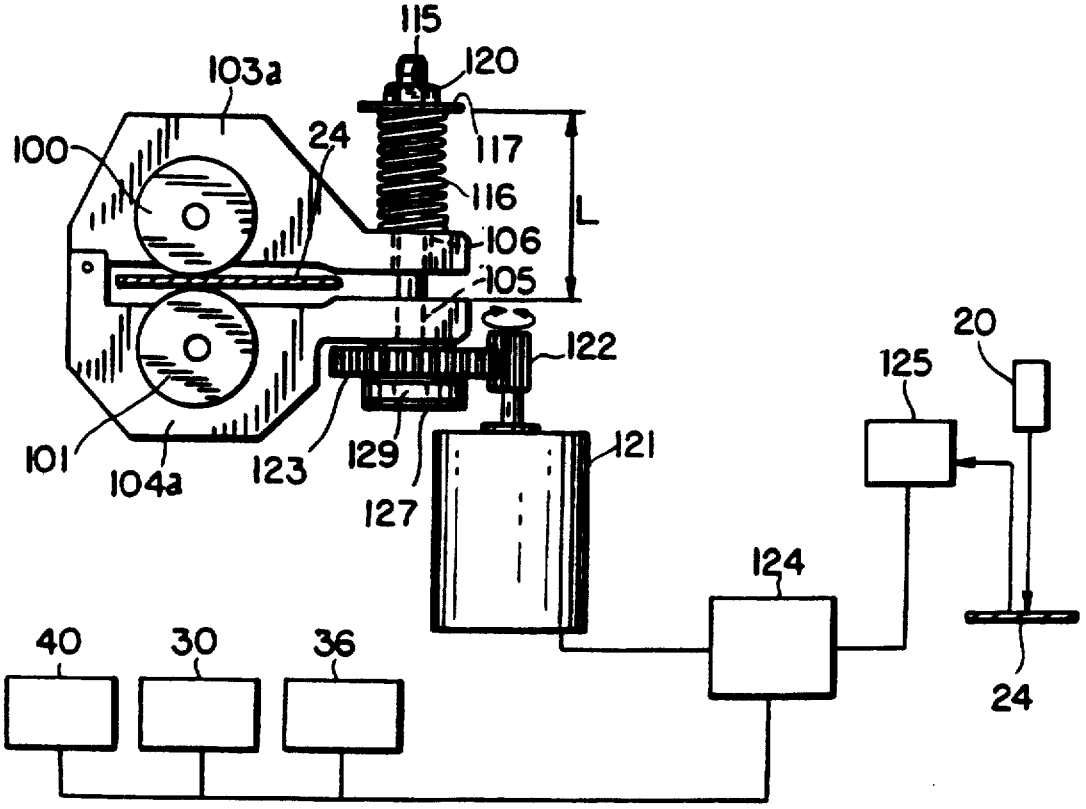
FIG. 4 is a diagrammatical view showing an automatic pressure control mechanism.

The lower pressing roller 101 is, as illustrated in FIGS. 3 and 4, rotatably supported by a pair of lower side arms 104a·104b which are fixed to the housing 10, while the upper pressing roller 100 is rotatably supported by a pair of upper side arms 103a·103b. Each pair of the uppers side arm 103a/103b and the lower side arm 104a/104b are interconnected by pivot shafts 114a·114b at the rear ends thereof, respectively, and the front ends of the upper arms 103a·103b are vertically swingable about the pivot shafts 114a·114b. Between the front ends of the lower arms 104a·104b, bridged is a guide plate 113 for guiding the recording sheet [14] *24*.

At the front end portion of each lower arm 104a/104b, formed is a through-hole 105, the inner surface of which is threaded to be engaged with a screw shaft 115a/115b, while the inner surface of a through-hole 106 formed on the corresponding position of each upper arm 103a/103b is not threaded and relatively slidably and rotatably receives the screw shaft 115a/115b therethrough.

At the lower end of the screw shaft 115a, secured are a driven gear 123 and a pulley 127, while a pulley 128 secured to the lower end of the screw shaft 115b is interconnected by a belt 129 to be rotated synchronously with the pulley 127. On the upper portion of each screw shaft 115a/115b protruded above each upper arm 103a/103b, a compression spring 116 is mounted and the extension range thereof is regulated by a nut 120 threaded on the screw shaft 115a/115b through a stopper plate 117. The distance L between the nut 120 and the lower arm 104a/104b is [changable] *changeable* by rotating the screw shaft 115a/115b relative to the lower side arm 104a/104b, and with this change of the distance L, the compression condition of the spring 116 varies. Thus, the pressure applied to the sheet [15] *24* by the pressing rollers 100·101 when the former passes between the latters is varied.

The compression condition of the spring 116 is varied by the pressure control mechanism. The mechanism comprises a stepping motor 121 and a driving gear 122 rotated by the motor 121 and engaged with the driven gear 123. The vertical length of the gear 122 is set to be engagable with the gear 123 even when the relative position of the gear 123 is changed in a predetermined range. The control unit 124 generating pulse signals is connected to the motor 121 so as to rotate the motor 121 selectively in forward or backward direction. The control unit 124 generates pulse signals for driving the motor 121 based upon output signals of a photo-sensor 125 which detects the degree of exposure on the sheet [14] *24*. Thus, the pressure applied to the sheet [15] *24* automatically varies in proportion to the degree of the exposure thereon. In addition, the compression condition of the spring 116 can be manually changed by threading the nut 20 into or out of the screw shaft 115a/115b.

Figure 5:
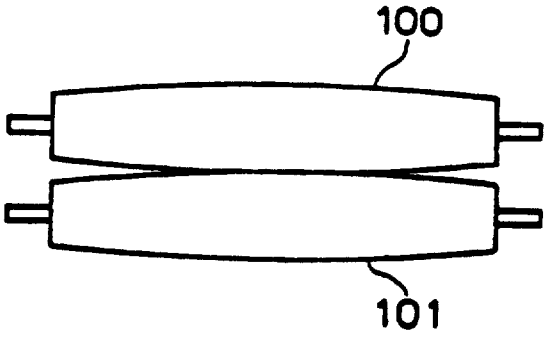
FIG. 5 is a schematic view showing pressing rollers.

The pressing rollers 100·101 are formed, as illustrated in FIG. 5, to have a diameter which gradually decreases from the lateral center to the both ends thereof. The ratio of the decrease in diameter is determined corresponding to the characteristic curve of the luminous flux distribution of the light source 18·18. One of the rollers 100·101, however, may be formed to be column.

With the above described imaging device, as the pressure applied to the recording sheet by the pressing rollers 100·101 is adjusted depending upon the exposure degree in the exposing step, the possibility of changing of the colourization level of the image printed on the recording sheet [14] *24* is minimized or eliminated. Further, as the pressure applied on the recording sheet [14] *24* decreases in the lateral direction on the recording sheet [14] *24*, the possibility of changing the colourization level in the lateral direction of the image printed on the recording sheet [14] *24* is minimized or eliminated. Thus, the obtained printing image is of uniform colour deepness and of a good quality.

In the modified embodiment, the output signals of the control unit 124 are led to the driving motors 30·36·40, as illustrated in FIG. 4 too, so as to adjust the revolutional numbers thereof and thereby changing the sheet feeding speed. With this change of the sheet feeding speed, the pressing time therefor by the pressing rollers 100·101 is changed, thereby the degree of pressing is adjusted in proportion to the degree of exposure. This speed control system is adoptable together with the above described pressure control system in such a manner, for instance, that the speed control system is additionally operated when the pressure control system is insufficient.

Figure 6:
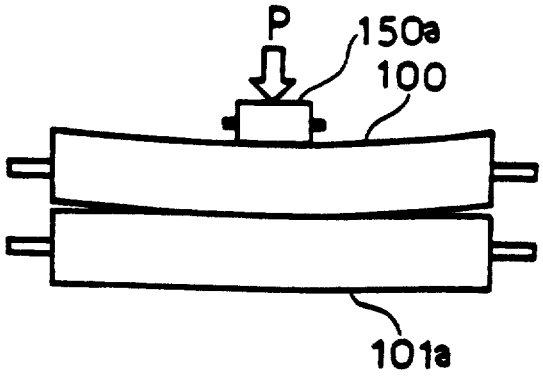
FIG. 6 is a schematic view showing other embodiment of pressing rollers.
Figure 7:
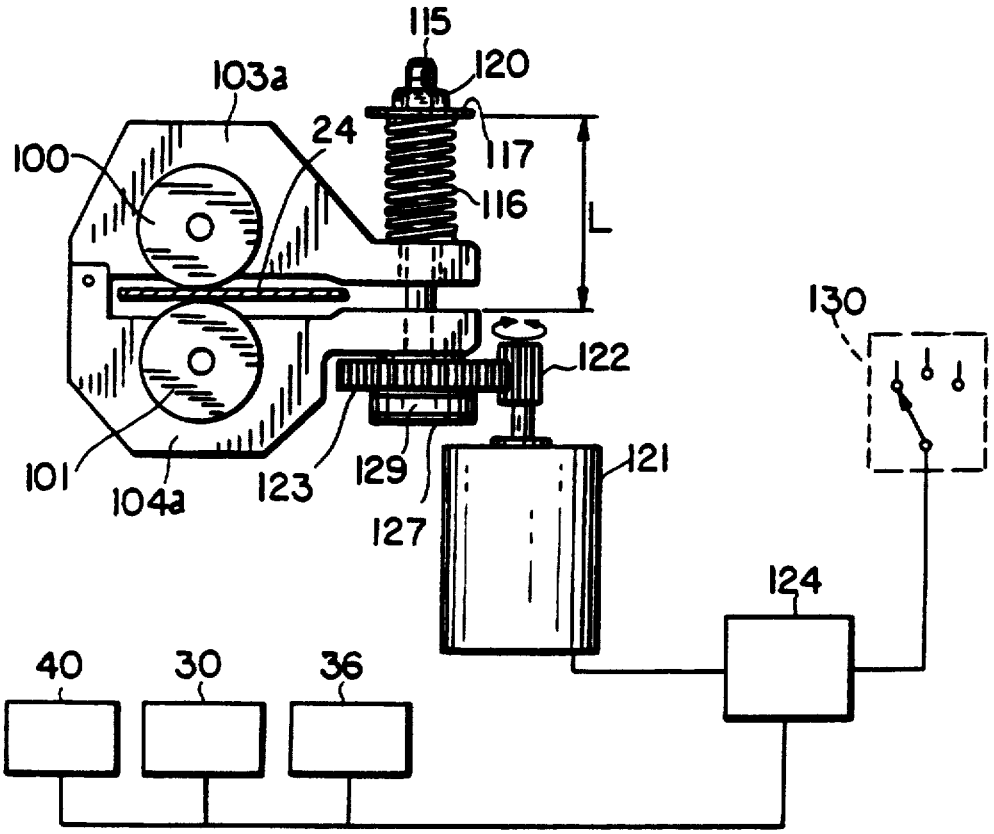
FIG. 7 is a diagrammatical view showing a manual pressure control mechanism.
Figure 8:
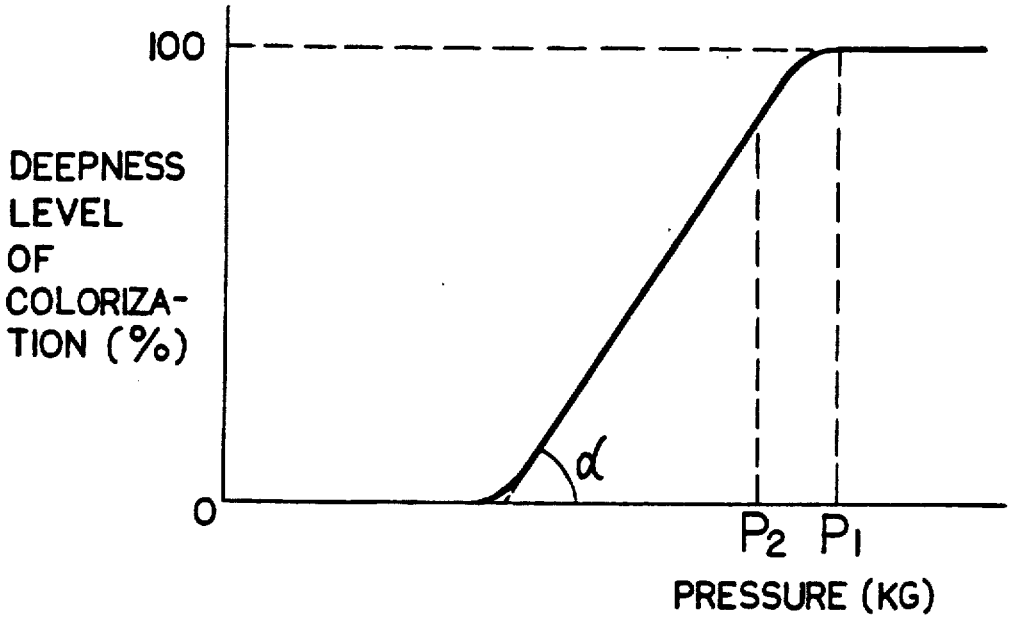
FIG. 8 is a [graph] *graph* graph showing a characteristic curve of general relationship between a pressure and a colorization level under the condition that a degree of exposure and a pressing time are fixed.
Figure 9:
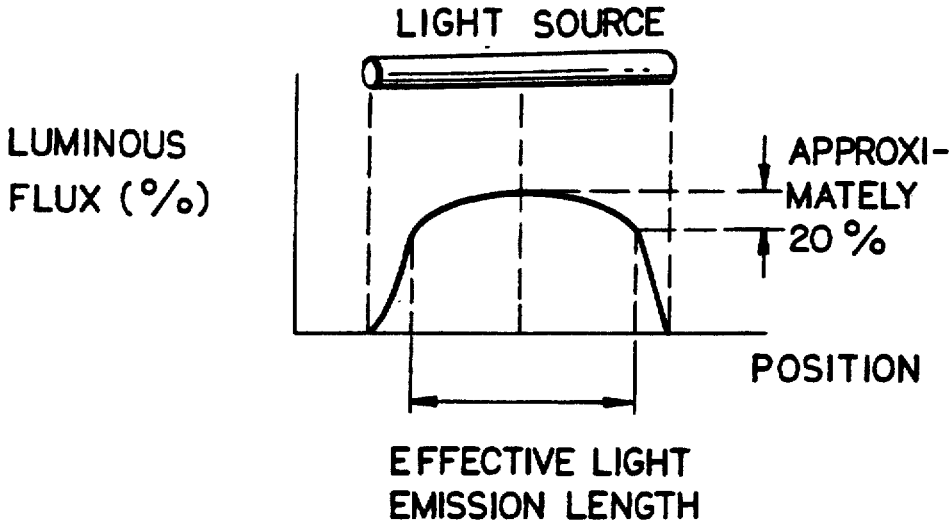
FIG. 9 is a graph showing a luminous flux distribution of a linear-shape light source.

In other modified embodiment, the pressing rollers 100a·101a are formed to be colums, as illustrated in FIG. 6, but the lateral center area of the upper roller 100a is additionally pressed by an [auxial] *axial* roller 150 so as to establish the difference in the pressure applied to the central area of the recording sheet [14] *24* and the both side portions thereof.

In still other embodiment, a deepness level switching member 130 is provided to manually change the level of the colour deepness depending upon the deepness condition of the original manuscript and/or the obtained image. By manually switching the member 130, the pressure applied by the pair of pressing rollers 100·101 and/or the revolutional numbers of the motors 30·36·40 are changed. This manual switching system is, of course, adoptable together with the above described automatic control system utilizing the photosensor 125 for making it possible to [manuary] *manually* adjust the colour deepness when the colour deepness of the obtained print under the automatic control system is unsatisfactory.

What is claimed is:

1. An imaging device comprising:

means for exposing a light on a photo and pressure sensitive recording sheet for forming a latent image thereon;

means for applying a pressure on said recording sheet for developing said latent image thereon; [and]

*means for detecting a degree of exposure on said recording sheet; and* means for *automatically* controlling a degree of pressing applied to said recording sheet by said pressure applying means *in relation to the degree of exposure detected by said detecting means.*

2. The imaging device according to claim 1 wherein said means for controlling a degree of pressing comprises means for controlling a pressure of said pressure applying means.

3. The imaging device according to claim 1 wherein said pressure applying means comprises a pair of pressing rollers, and said means for controlling a degree of pressing comprises means for controlling rotary speed of said pressing rollers.

[4. The imaging device according to claim 1 which further comprises means for detecting a degree of exposure on said recording sheet, and wherein said means controlling a degree of pressing automatically controls a degree of pressing depending upon the degree of exposure detected by said detecting means.]

[5. The imaging device according to claim 1 wherein said means for controlling a degree of pressing is operated by manual switching means.]

6. The imaging device according to claim 1 wherein said pressure applying means comprises a pair of pressing rollers, each sides of which being rotatably supported by a pair of upper and lower arms, one ends of said arms being pivoted while the other ends being relatively swingable, and means for biasing said other end of one of said arms to that of the other one.

7. The imaging device according to claim 6 wherein said biasing means comprises a compression spring mounted on a screw shaft and arranged between said one of arms and a stopper mounted on one end of said screw shaft, said screw shaft being threadably connected to said other end of arms and relatively slidably and rotatably passing through said one of arms.

8. The imaging device according to claim 7 wherein said stopper comprises a nut threaded on one end of said screw shaft.

9. The imaging device according to claim 7 wherein said means for controlling a degree of pressing comprises means for rotating said screw shaft so as to vary the compression condition of said spring.

10. The imaging device according to claim 9 wherein said rotating means comprises a driven gear secured to one end of said screw shaft and a driving gear engaged with said driven gear and rotated by a stepping motor.

11. The imaging device according to claim 1 wherein said light exposing means comprises a linear-shape light source, and said pressure applying means comprises a pair of pressing rollers, the diameter of at least one of said pressing rollers being decreased from the lateral center portion towards both end portions thereof substantially in proportion to the luminous flux distribution of said linea-shape light source.

12. The imaging device according to claim 1 wherein said light exposing means is a linear-shape light source, and said pressure applying means comprises a pair of pressing rollers and means for additionally pressing the central area of said pressing rollers.

13. An imaging device wherein a latent image is formed on a photo and pressure sensitive recording sheet by exposing a light thereon, *said light having a characteristic curve,* and the latent image is then developed by applying a pressure thereon with a pair of pressing rollers, the improvement which comprises in that the diameter of at least one of said pressing rollers being decreased from the lateral center portion toward both ends portions thereof, *in a manner corresponding to said characteristic curve.*

*14. An imaging device comprising:*

*means for exposing a light on a photo and pressure sensitive recording sheet for forming a latent image thereon;*

*means for applying a pressure on said recording sheet for developing said latent image thereon; and*

*means for controlling a degree of pressing applied to said recording sheet by said pressure applying means, said means for controlling a degree of pressing including*

*electric drive means operatively connected with said pressure applying means and manual switch means for setting a desired degree of pressing, wherein said means for controlling a degree of pressing operates said electric drive means depending upon a desired degree of pressing set by said manual switch means.*

*15. The imaging device according to claim 14 wherein said pressure applying means comprises a pair of pressing rollers that press a photo and pressure sensitive recording sheet therebetween and said electric drive means comprises a stepping motor operative to adjust a pressure between said pressing rollers.*

*16. An imaging device comprising:*

*means for exposing a light on a photo and pressure sensitive recording sheet for forming a latent image thereon;*

*means for applying a pressure on said recording sheet for developing said latent image thereon to obtain a visible image;*

*means for detecting a degree of a factor which influences the color of said visible image; and*

*means for automatically controlling a degree of pressing applied to said recording sheet by said pressure applying means according to the degree of said factor detected by said detecting means.*

*17. The device in accordance with claim 16 wherein said degree of a factor comprises the degree of exposure of said recording sheet.*

* * * * *